United States Patent
Tullberg et al.

(10) Patent No.: US 12,107,604 B2
(45) Date of Patent: Oct. 1, 2024

(54) NETWORK NODE AND METHOD PERFORMED THEREIN FOR HANDLING RECEIVED SIGNAL

(71) Applicant: Telefonaktiebolaget LM Ericsson (publ), Stockholm (SE)

(72) Inventors: Hugo Tullberg, Nyköping (SE); Guido Carlo Ferrante, Stockholm (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 19 days.

(21) Appl. No.: 18/002,306

(22) PCT Filed: Jun. 23, 2020

(86) PCT No.: PCT/SE2020/050646
§ 371 (c)(1),
(2) Date: Dec. 19, 2022

(87) PCT Pub. No.: WO2021/262049
PCT Pub. Date: Dec. 30, 2021

(65) Prior Publication Data
US 2023/0353169 A1    Nov. 2, 2023

(51) Int. Cl.
*H03M 13/11* (2006.01)
*H03M 13/00* (2006.01)

(52) U.S. Cl.
CPC ...... *H03M 13/1137* (2013.01); *H03M 13/114* (2013.01); *H03M 13/616* (2013.01)

(58) Field of Classification Search
None
See application file for complete search history.

(56) References Cited

U.S. PATENT DOCUMENTS

| | | |
|---|---|---|
| 2003/0033575 A1 | 2/2003 | Richardson et al. |
| 2004/0153934 A1 | 8/2004 | Jin et al. |
| 2004/0187129 A1 | 9/2004 | Richardson |
| 2005/0185575 A1 * | 8/2005 | Hansen ............... H04B 7/0613 370/208 |

(Continued)

FOREIGN PATENT DOCUMENTS

| | | |
|---|---|---|
| CN | 106911336 A | 6/2017 |
| CN | 109981117 A | 7/2019 |
| WO | WO-2023090475 A1 * | 5/2023 |

OTHER PUBLICATIONS

International Search Report and Written Opinion dated Apr. 27, 2021 for International Application No. PCT/SE2020/050646 filed Jun. 23, 2020, consisting of 13—pages.

(Continued)

*Primary Examiner* — Guerrier Merant
(74) *Attorney, Agent, or Firm* — Weisberg I.P. Law, P.A.

(57) ABSTRACT

Embodiments herein relate to e.g., a method performed by a network node for handling a received signal in a communication network. The network node includes at least two processing cores connected via a bus system for handling the received signal. The network node receives input bits associated with the received signal and permutes the received input bits into input bits of permuted order taking at least number of processing cores into account. The network node further decodes the input bits of the permuted order and re-permutes the decoded input bits into original order.

17 Claims, 12 Drawing Sheets

(56) References Cited

U.S. PATENT DOCUMENTS

| | | | |
|---|---|---|---|
| 2005/0246616 A1* | 11/2005 | Choi | H03M 13/6362 714/801 |
| 2009/0013356 A1* | 1/2009 | Doerr | H04N 21/41407 725/62 |
| 2012/0155239 A1* | 6/2012 | Nishida | G11B 20/1866 |
| 2016/0087653 A1* | 3/2016 | Yang | H03M 13/1128 714/752 |
| 2016/0226468 A1 | 8/2016 | Ge et al. | |
| 2018/0109269 A1 | 4/2018 | Richardson et al. | |
| 2018/0159555 A1* | 6/2018 | Ryabinin | H03M 13/3715 |

OTHER PUBLICATIONS

Xu, Qiumin et al.; Graph Processing on GPUs: Where are the Bottlenecks?; 2014 IEEE International Symposium on Workload Charaterization (IISWC); 2014, consisting of 10—pages.

Davies, M. et al.; Loihi: A Neuromorphic Manycore Processor with On-Chip Learning, IEEE Micro, vol. 38, No. 1; Jan./Feb. 2018; consisting of 18—pages.

Merolla, P.A. et al.; A million spiking-neuron integrated circuit with a scalable communication network and interface; Science; vol. 345, No. 6197; 2014; consisting of 40—pages.

Yan, Yexin et al.; Efficient Reward-Based Structural Plasticity on a SpinNaker 2 Prototype; IEEE Transactions on Biomedical Circuits and Systems, vol. 13, No. 3; Mar. 20, 2019; consisting of 15—pages.

Jouppi, Norman P. et al.; In-Datacenter Performance Analysis of a Tensor Processing Unit; 44th International Symposium on Computer Architecture (ISCA); Jun. 26, 2017; Toronto, Canada; consisting of 17—pages.

Nvidia, Nvidia Tesla P100, The Most Advanced Datacenter Accelerator Ever Built Featuring Pascal GP100, the World's Fastest GPU; Whitepaper, vol. 1.1, 2016, consisting of 45—pages.

CCSDS, Short Block Length LDPC Codes for TC Synchronization and Channel Coding, Research and Development for Space Data System Standards Experimental Specification; Orange Book; Apr. 2015, consisting of 40—pages.

* cited by examiner

NETWORK NODE AND METHOD PERFORMED THEREIN FOR HANDLING RECEIVED SIGNAL

CROSS-REFERENCE TO RELATED APPLICATION

This application is a Submission Under 35 U.S.C. § 371 for U.S. National Stage Patent Application of International Application Number: PCT/SE2020/050646, filed Jun. 23, 2020 entitled "NETWORK NODE AND METHOD PERFORMED THEREIN FOR HANDLING RECEIVED SIGNAL," the entirety of which is incorporated herein by reference.

TECHNICAL FIELD

Embodiments herein relate to a network node and a method performed therein regarding communication. Furthermore, a computer program product and a computer readable storage medium are also provided herein. In particular, embodiments herein relate to handling received signal e.g. decoding data transmissions, in a communication network.

BACKGROUND

In a typical communication network, user equipments (UE), also known as wireless communication devices, mobile stations, wireless devices, stations (STA) and/or mobile stations, may communicate via a Radio Access Network (RAN) to one or more core networks (CN). The RAN covers a geographical area which is divided into service areas, also known as cells, with each cell being served by a radio network node also referred to as access node e.g., a Wi-Fi access point or a radio base station (RBS), which in some networks may also be called, for example, a NodeB, an eNodeB or a gNodeB. The cell is a geographical area where radio coverage is provided by the radio network node. The radio network node operates on radio frequencies to communicate over an air interface with the UEs within range of the radio network node. The radio network node communicates over a downlink (DL) to the UE and the UE communicates over an uplink (UL) to the radio network node.

A Universal Mobile Telecommunications network (UMTS) is a third generation (3G) telecommunications network, which evolved from the second generation (2G) Global System for Mobile Communications (GSM). The UMTS terrestrial radio access network (UTRAN) is essentially a RAN using wideband code division multiple access (WCDMA) and/or High Speed Packet Access (HSPA) for user equipments. In a forum known as the Third Generation Partnership Project (3GPP), telecommunications suppliers propose and agree upon standards for e.g. third generation networks, and investigate enhanced data rate and radio capacity and upcoming generation networks. In some RANs, e.g. as in UMTS, several radio network nodes may be connected, e.g., by landlines or microwave, to a controller node, such as a radio network controller (RNC) or a base station controller (BSC), which supervises and coordinates various activities of the plural radio network nodes connected thereto. This type of connection is sometimes referred to as a backhaul connection. The RNCs and BSCs are typically connected to one or more core networks.

Specifications for the Evolved Packet System (EPS), also called a Fourth Generation (4G) network, have been completed within the 3GPP and also specifications for a Fifth Generation (5G) network denoted as release-15, this work continues in the coming 3GPP releases, for example to specify a 6th generation network. The EPS comprises the Evolved Universal Terrestrial Radio Access Network (E-UTRAN), also known as the Long Term Evolution (LTE) radio access network, and the Evolved Packet Core (EPC), also known as System Architecture Evolution (SAE) core network. E-UTRAN/LTE is a variant of a 3GPP radio access network wherein the radio network nodes are directly connected to the EPC core network rather than to RNCs. In general, in E-UTRAN/LTE the functions of an RNC are distributed between the radio network nodes, e.g. eNodeBs in LTE, and the core network. As such, the RAN of an EPS has an essentially "flat" architecture comprising radio network nodes connected directly to one or more core networks, i.e. they are not connected to RNCs. To compensate for that, the E-UTRAN specification defines a direct interface between the radio network nodes, this interface being denoted the X2 interface.

With the 5G technologies such as New Radio (NR), the use of very many transmit- and receive-antenna elements is of great interest as it makes it possible to utilize beamforming, such as transmit-side and receive-side beamforming. Transmit-side beamforming means that the transmitter can amplify the transmitted signals in a selected direction or directions, while suppressing the transmitted signals in other directions.

Similarly, on the receive-side, a receiver can amplify signals from a selected direction or directions, while suppressing unwanted signals from other directions.

In telecommunication and coding theory, an error correcting code (ECC) may be used for controlling errors in data over unreliable or noisy communication channels. Forward error correction (FEC) is a technique used wherein the central idea is that the sender encodes the message in a redundant way, by using an ECC. The redundancy allows the receiver to detect a limited number of errors that may occur anywhere in the message, and often to correct these errors without re-transmission. FEC gives the receiver the ability to correct errors without needing a reverse channel to request re-transmission of data, but at the cost of a fixed, higher forward channel bandwidth. In the past decades, several near-capacity forward error correcting (FEC) codes have emerged, including Turbo codes, Low-density parity-check (LDPC) codes and Polar codes. In 3GPP, Turbo codes are used in 3G UMTS and 4G LTE, and LDPC codes are used for the user plane in 5G NR and Polar codes for the control plane in 5G NR. In other standards, LDPC codes are used in e.g., Wi-Fi, WiGiG, WiMax and DVB.

For all three code classes, the decoding is much more complex than the encoding, since it uses iterative or parallel processes with "soft bits", i.e. probabilistic representations of the encoded bits. Turbo codes and LDPC codes use iterative decoding, where each successive attempt at decoding the information block informs the next one, until the process converges to a legitimate code-word. Polar codes, on the other hand, select the recovered information block from a list of candidates obtained from a parallel successive cancellation decoding process.

Herein binary LDPC codes are exemplified, but the ideas are applicable to non-binary LDPC codes and may be applied to other code classes as well.

LDPC Code Representation

LDPC codes are defined by a sparse parity-check matrix, H, used in the decoding process. In the encoding, a corresponding generator matrix G is conceptually used. While H can be randomly generated, it is often desirable to impose some structure to simplify the encoding.

A bipartite graph is often used to represent and visualize an (n, k)—LDPC code, wherein n is the number of bits in a codeword and k is the number of information bits. A bipartite graph consists of two sets of nodes: a set of variable nodes, one for each column of H, and a set of check nodes, one for each row of H. A given variable node is connected to a given check node if and only if the corresponding entry of H is equal to 1. These graphs are sometimes referred to as Tanner graphs or factor graphs.

FIG. 1 shows an example of an H matrix, and the corresponding graph, using Forney's factor graph notation. In this graph, n variable nodes, circles in the graph, are connected to (n–k) constraint or check nodes, squares in the graph. Note that this is not a real LDPC code, the H-matrix is small and the density, fraction of 1's with respect to the total number of elements, is high. However, the graph representation can be applied to LDPC codes as well, the only difference being the size and the number of edges. In this graph, n variable nodes on the left side of the graph (n=7) are connected to m check nodes on the right side of the graph (m=3). The number of bits to be encoded is k=n–m, in this case, k=4. Each check node sums (modulo 2) the bits of the variable nodes that are connected to it. The bits of a valid message, i.e. encoded bits or codeword, when placed at the variable nodes, satisfy the graphical constraints, that is, each check node outputs 0 after the sum modulo 2 of the values of the connected variable nodes, known as "neighbours". The bits of a generic word, namely a generic sequence of 0s and 1s, do not, in general, satisfy the constraints.

For a regular LDPC code, variable degree, i.e., the number of ones in a row is the same for all rows, and check degree, i.e., the number of ones in a column is the same for all columns. For an irregular LDPC code, the variable degrees are not the same, and/or the check degrees are not the same.

LDPC Decoding and Parallelism.

The iterative decoding of an LDPC code involves passing messages between the nodes along the edges of the code graph. Any algorithm in this class of decoding algorithms is called a message passing (MP) algorithm. Each of the nodes in the graph works in isolation with information available along the connected edges only, local information only. These decoding algorithms require passing of the messages back and forth between the nodes for a fixed number of times, known as "iterations", until a codeword is found, or until another predetermined stopping criterion is met, hence the notion "iterative decoding" algorithms.

The fact that the nodes work independently allows different types of parallelism to be used to speed up the decoding. The updates of the messages at nodes of a given type, variable node or check node, can either be computed serially or in a partially parallel or fully parallel fashion. Alternatively, instead of iterating back and forth between variable nodes and check nodes, the decoder can be "unrolled", i.e., multiple copies of the variable nodes and check nodes can be implemented, and messages passed forward in a pipeline. In both node parallelization and iteration unrolling, multiple compute elements are created, and messages are passed between them. Depending on the message resolution, i.e., the number of bits used to represent the soft values, the amount of data to pass between nodes can be substantial.

GPU/TPU Architectures

Graphics Processor Units (GPU) were originally designed to reduce the execution time of heavy graphics applications, e.g. video rendering and games. Today, General Purpose GPUs (GPGPU) are one of the choices of hardware to accelerate computational workloads in e.g. Machine Learning (ML), Deep Learning (DL), and Artificial Intelligence (AI). Common to all these applications is that the computations can be broken down into many parallel, comparably simple operations see [1].

Inspired by the application of GPUs for ML and AI, a new kind of compute units are being developed, specifically for ML and AI. These processing units are sometimes referred to as neuromorphic computing units, since they mimic the brain, or Tensor Processing Units (TPUs), since they are optimized for tensor processing in ML. Examples of TPUs include Loihi [2], TrueNorth [3], SpiNNaker [4], Google's TPU [5].

Common to GPU architectures and TPU architectures, see FIG. 2, is that a large number of compute cores is connected by some bus system. The computation takes place in the processing cores, and data transfer between cores and to other circuitry takes place over the bus system.

Since LDPC decoding can be parallelized, it is natural to consider implementation of LDPC decoders on GPUs, TPUs, and similar parallel hardware. LDPC decoding can be implemented on application-specific integrated circuits (ASICs) as well, and designs for unrolled, parallel implementations of LDPC decoders are available today for such architectures. The data transport is an issue there as well, and ASIC implementation can benefit from embodiments disclosed herein.

GPU and TPU Bottlenecks

Whereas the computations in the processing cores are fast, the communication over the bus system and/or to memory is a performance bottleneck see e.g. [3]. GPU performance is investigated in [6] and it is concluded that graph applications, of which LDPC decoding is one that is not explicitly mentioned in [6], tend to execute kernel and data transfer functions more frequently than non-graph applications. The frequent kernel invocations lead to ineffective use of caches as well. Therefore, the performance overhead due to transfer of the bus as well as long latency memory operations is higher in the graph applications than in the non-graph applications.

Usually, when designing LDPC codes we strive for the best communication performance, i.e., the lowest bit or codeword error rate, for a given code rate, codeword length and number of decoding iterations. LDPC codes are either regular or irregular. Regular LDPC codes are codes where all variable nodes have the same degree, i.e., number of connections, and all check nodes have the same degree (though the degree of the variable nodes is less than the degree of the check nodes). Irregular codes are codes where the different variable nodes have different degrees and similarly for check nodes. The best performing LDPC codes are irregular.

For practical purposes, a structure is often imposed on the codes to simplify the encoding. Cyclic or quasi-cyclic codes are used. The 5G NR codes are quasi-cyclic.

In the decoding the computations are performed in the nodes of the graph, and the edges are paths that in messages (intermediate beliefs of bit values) are passed. The node computation will take place in the processing cores of GPUs/TPUs.

An LDPC code not designed for GPU/TPU decoding may have very large check node degrees that may not be fitted onto a single core (depending on the size of the processing cores). What is more likely is that when the LDPC nodes are mapped to different cores, it results in many edges connecting different cores. Hence, LDPC codes that are not designed for decoding on GPUs and TPUs can have block lengths and H-matrices, and corresponding decoding graphs, that span over multiple processing cores and make extensive use of the interconnecting bus system. Thus, if a non-multicore-optimized LDPC code, such as the 3GPP 5G NR LDPC code, is decoded on e.g. GPUs or TPUs, the actual performance is not as good as can be expected. In particular, the data transfer on the bus can slow down decoding considerably.

SUMMARY

Decoding methods and code design of LDPC codes for multicore hardware have previously been discussed but herein solutions are presented for the problems of modifying codes that were not designed for multicore hardware to fit multicore decoding. An object herein is thus, to provide a mechanism to improve performance for decoding data in an efficient manner in a communication network.

According to an aspect the object is achieved, according to embodiments herein, by providing a method performed by a network node for handling a received signal in a communication network, wherein the network node comprises at least two processing cores connected via a bus system for handling the received signal. The network node receives input bits associated with the received signal, and permutes the received input bits into input bits of permuted order taking at least number of processing cores into account. The network node decodes the input bits of the permuted order; and re-permutes the decoded input bits into original order.

It is furthermore provided herein a computer program product comprising instructions, which, when executed on at least one processor, cause the at least one processor to carry out any of the methods above, as performed by the network node. It is additionally provided herein a computer-readable storage medium, having stored therein a computer program product comprising instructions which, when executed on at least one processor, cause the at least one processor to carry out the method according to any of the methods above, as performed by the network node.

According to embodiments herein a network node is also herein provided for handling a received signal in a communication network, wherein the network node comprises at least two processing cores connected via a bus system for handling the received signal. The network node is configured to receive input bits associated with the received signal, and to permute the received input bits into input bits of permuted order taking at least number of processing cores into account. The network node is further configured to decode the input bits of the permuted order; and to re-permute the decoded input bits into original order.

Embodiments herein disclose e.g. a method to transform, i.e. permute, any code into a form suitable for decoding performance on multicore hardware. The goal of embodiments herein is to use the bus system between the processing cores the minimum number of times while performing as much computation as possible within the processing cores without losing in communication performance, e.g. frame or bit error rate. This is done by permuting e.g. the parity check matrix H of any code to fit multicore decoding. Permutations of the H matrix do not change the properties of the code itself but impact how the check equations are mapped to decoding hardware and how the messages are passed within a hardware processing core and between processing cores. Embodiments herein enable that messages between the processing cores are updated less times and not at every iteration as in classic message passing algorithms.

Given herein are examples of some methods to perform the permutations to achieve an efficient decoding process. Thus, embodiments herein achieve an improved performance for decoding data, in terms of e.g. reduced latency, fewer iterations, and/or lower power consumption, in an efficient manner in the communication network.

BRIEF DESCRIPTION OF THE DRAWINGS

Embodiments will now be described in more detail in relation to the enclosed drawings, in which.

DETAILED DESCRIPTION

Figure 1:
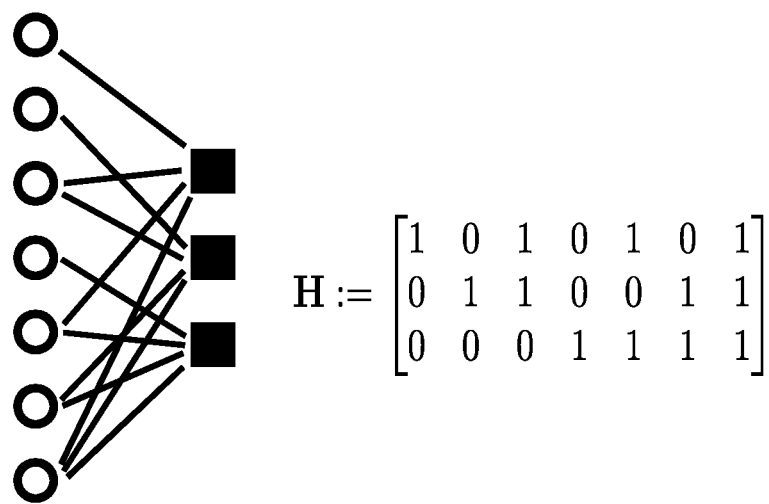
FIG. 1 shows a visual representation of variables and functions of a codeword.
Figure 2:
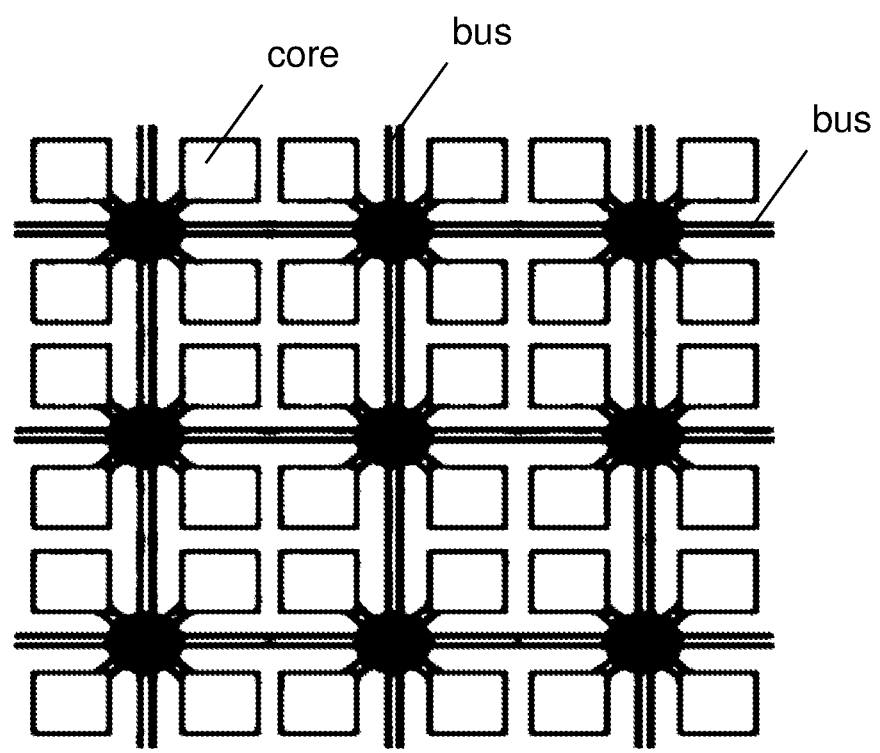
FIG. 2 shows an arrangement comprising a number of processing cores and connected via a bus arrangement.
Figure 3:
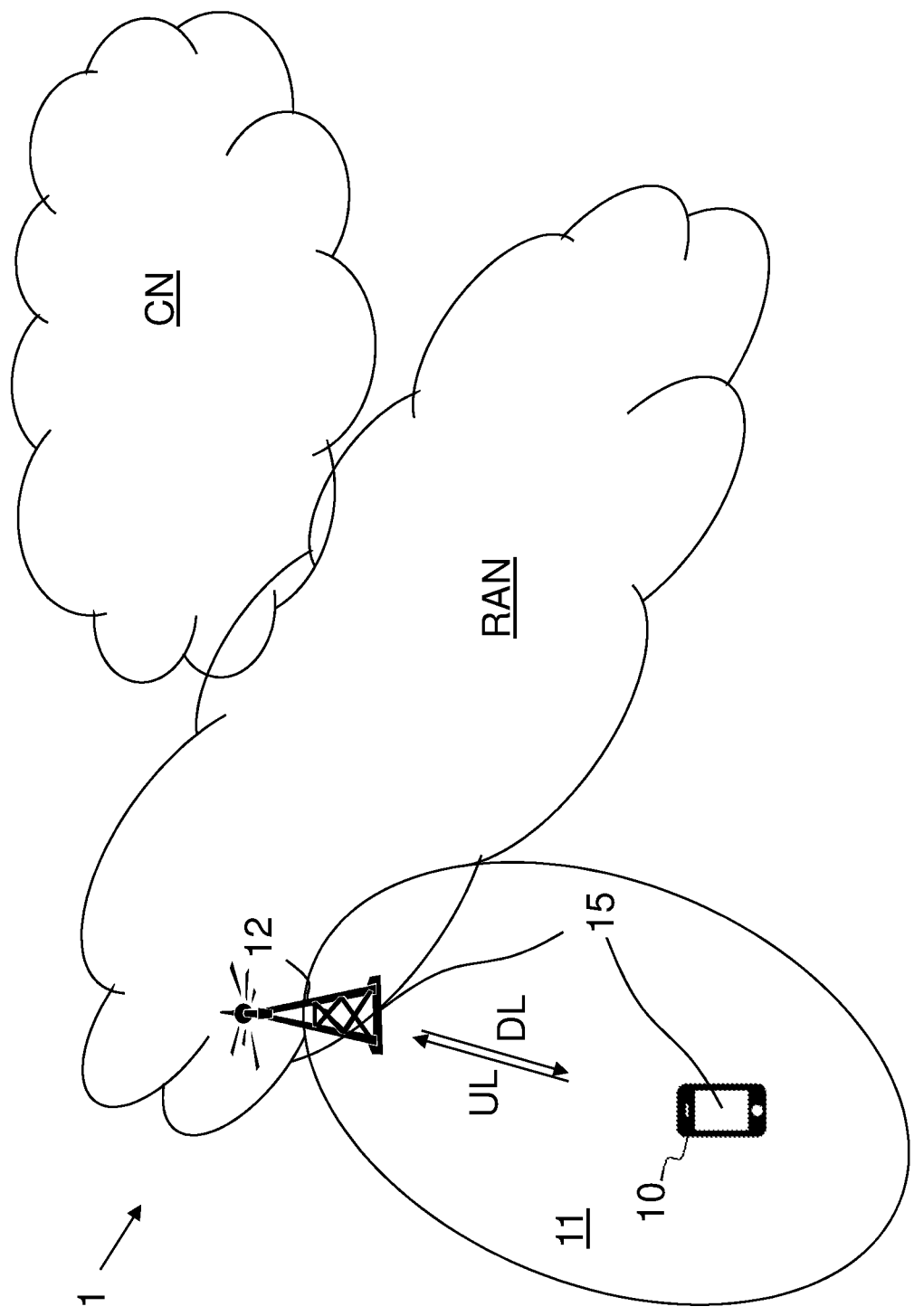
FIG. 3 is a schematic overview depicting a wireless communication network according to a deployment of embodiments herein.

Embodiments herein relate to communication networks in general. FIG. 3 is a schematic overview depicting a communication network 1. The communication network 1 may comprise one or more RANs and one or more CNs. The communication network 1 may use one or a number of different technologies. Embodiments herein relate to recent technology trends that are of particular interest in a 5G context, however, embodiments are also applicable in further development of existing wireless communication systems such as e.g. 6G, beyond 5G/6G, LTE, WiFi, and Wideband Code Division Multiple Access (WCDMA).

In the communication network 1, wireless devices are configured to communicate with the RAN e.g. a UE 10, such as a communication device. It should be understood by the skilled in the art that "UE" is a non-limiting term which means any terminal, wireless communication terminal, wireless device, narrowband-internet of things (NB-IoT) device, Machine Type Communication (MTC) device, Device to Device (D2D) terminal, or node e.g. smart phone, laptop, mobile phone, sensor, relay, mobile tablets, wireless router, or even a small base station capable of communicating using radio communication with a radio network node or a wireless device.

The communication network 1 comprises a number of network nodes such as a radio network node 12 also referred to as source access node providing radio coverage over a geographical area, a service area 11, of a first radio access technology (RAT), such as NR, LTE or similar. The radio network node 12 may be a transmission and reception point such as an access node, an access controller, a base station, e.g. a radio base station such as a gNodeB (gNB), an evolved Node B (eNB, eNode B), a NodeB, a base transceiver station, a radio remote unit, an Access Point Base Station, a base station router, a Wireless Local Area Network (WLAN) access point or an Access Point Station (AP STA), a transmission arrangement of a radio base station, a stand-alone access point or any other network unit or node capable of communicating with a wireless device within the area served by the radio network node 12 depending e.g. on the first radio access technology and terminology used. The radio network node 12 may be referred to as a serving radio network node such as a source access node wherein the service area may be referred to as a serving cell, and the serving radio network node communicates with the UEs in form of DL transmissions to the UEs and UL transmissions from the UEs. It should be noted that a service area may be denoted as cell, beam, beam group or similar to define an area of radio coverage. Signalling of data is performed between the radio network nodes and/or UEs such as uplink (UL) from the UE 10 to the radio network node 12, or downlink (DL) from the radio network node 12 to the UE 10.

The communication network 1 may further comprise one or more other network nodes such as core network nodes, Operations, administration and maintenance (OAM) nodes, data processing nodes or similar.

In telecommunication and coding theory, an error correcting code (ECC) may be used for controlling errors in data transferred over unreliable or noisy communication channels. Forward error correction (FEC) is a technique used wherein the central idea is that the sender encodes the message in a redundant way, by using an ECC. The redundancy allows a receiver such as the UE or the radio network node 12 to detect a limited number of errors that may occur anywhere in the message, and often to correct these errors without re-transmission. FEC gives the receiver the ability to correct errors without necessarily needing a reverse channel to request re-transmission of data, but at the cost of a fixed, higher forward channel bandwidth.

According to embodiments herein a network node 15 as also denoted as a receiving device such as the UE 10, the radio network node 12 or another network node comprises at least two processing cores connected with one another via a bus or a bus system. As an alternative, a Distributed Node (DN) and functionality, e.g. comprised in a cloud may be used for performing or partly performing the methods and actions described herein. The network node 15 decodes a received signal, such as received FEC encoded bits, by performing iterations also referred to as message passing. Message passing, also denoted as decoding algorithm, may need passing of the messages back and forth between nodes, e.g. variable nodes and check nodes, over edges for a fixed number of times (known as "iterations") or until the result is achieved. According to the methods herein messages between the at least two processing cores are updated using a matrix representation wherein a H matrix for any code is transformed into a format H' suitable for decoding on multicore hardware. The transformed matrix H' may have block properties with higher density (fraction of 1's) on the main diagonal blocks and less dense or even some all-zero blocks that are off the diagonal blocks.

A parity check matrix of already existing codes can be modified to fit multicore decoding by using the solutions described herein. The computing features enabled by architectures similar to those of GPUs or TPUs, in particular their high parallelization, can be made available to decode existing codes.

It should be noted that the communication performance of a single-core architecture may be superior to that of a multi-core architecture with the same parameters (e.g. area, fabrication process, etc.) since the latter can be seen as a special case of the former. However, the single-core architecture is often an application-specific integrated circuit (ASIC) which is more expensive and cannot be altered/reprogrammed after production. GPUs and TPUs are programmable and produced in large volumes which reduce prices of manufacturing the GPUs and TPUs. At the same time, properly designed message passing algorithms exploit the parallelization offered by GPU- and TPU-like architectures without incurring in significant performance loss. Therefore, methods are herein disclosed to employ GPU- and TPU-like hardware, i.e. using two or more processing cores, for LDPC decoding.

It should further be noted that embodiments herein may be implemented in any multicore architecture with a bus system or similar communication mechanism among processing cores.

Figure 4:
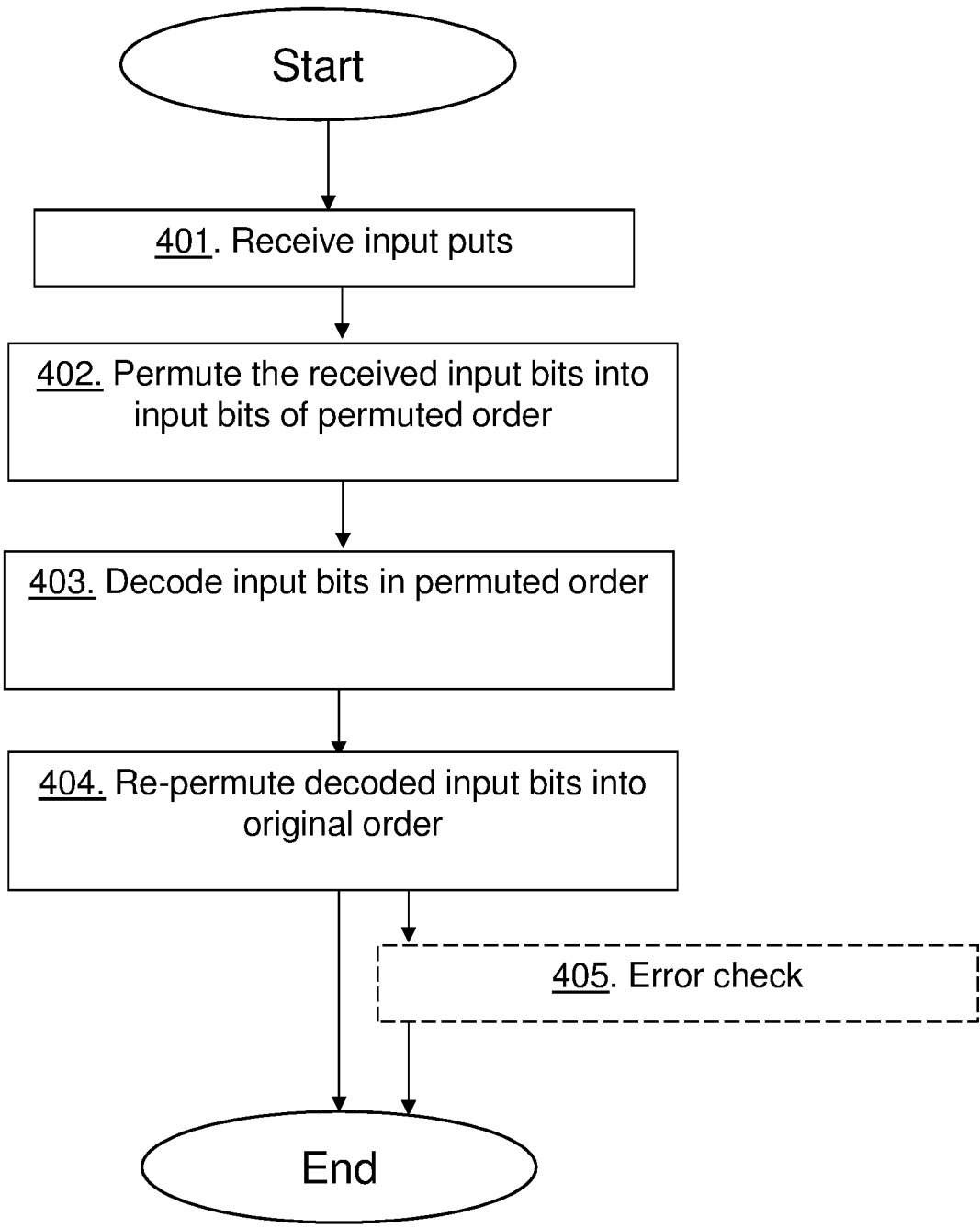
FIG. 4 shows a method performed by a network node according to embodiments herein.

The method actions performed by the network node 15 for handling a received signal in the communication network 1 according to embodiments will now be described with reference to a flowchart depicted in FIG. 4. The network node 15 comprises at least two processing cores connected via a bus system for handling the received signal. The actions do not have to be taken in the order stated below, but may be taken in any suitable order. Actions performed in some embodiments are marked with dashed boxes.

Action 401. The network node 15 may receive input bits associated with the received signal, e.g. received bits are demodulated into input bits.

Action 402. The network node 15 transforms, i.e. permutes, the received input bits into input bits of permuted order taking at least number of processing cores into account. This permutation may be performed when passing the bits to the multicore decoder or a standalone action. The network node 15 may further when permuting the received input bits, take into account variable inputs, check nodes and edges within communities of variable inputs, check nodes and edges, and across the communities in the code graph. The transformation may be done by finding two permutation matrixes L and R such that H'=L*H*R where H' is the modified parity check matrix with block properties. The network node 15 may permute the received input bits by swapping columns and/or rows in an original matrix representation into a modified matrix representation used when decoding the input bits. The network node 15 may e.g. swap rows and columns of the matrix H or relabel the columns or rows. The modified matrix representation may comprise the denser configuration of ones of submatrices arranged diagonally in the modified matrix representation. To determine to which degree a matrix is block diagonal, we may use a "diagonality metric" $\mu$ computed as $$\mu = \frac{\text{number of 1s in the blocks on the main diagonal}}{\text{total number of 1s in the matrix}}.$$

For a b-by-b block matrix with uniform distribution of 1s over the matrix $$\mu = \frac{1}{b},$$

and for a matric where all off-diagonal blocks are all-zero μ=1. Note that this results in b independent codes and a worse communication performance. Hence μ should be $$\frac{1}{b} < \mu < 1.$$

Finding optimal values for and densities of different blocks in the matrix may be based on other metrics. The selection of columns and/or rows to swap may be performed randomly, and/or using a process based on sum of ones in rows and/or columns in the original matrix representation.

Action 403. The network node 15 decodes the input bits in the permuted order, e.g. using the modified matrix representation. Each row of the modified matrix representation may correspond to a parity check equation and each column of the modified matrix representation may correspond to a variable input of the demodulated signal. The modified matrix representation may comprise a more dense configuration of ones of submatrices corresponding to respective processing core of the at least two processing cores than the rest of submatrices of the modified matrix representation. The network node may thus permute the received input bits to establish the modified matrix representation used when decoding the input bits. The modified matrix representation may e.g. comprise the denser configuration of ones of submatrices arranged diagonally in the matrix representation. The input bits may represent a codeword e.g. FEC codeword such as an LDPC code. More than two processing cores may be used and the exchange between the processing cores may take place in many ways, e.g., one-to-one, multiple disjoint one-to-one, one-to many, many to one, depending on the limitations of the actual hardware. E.g. an LDPC code consists of a number of parity check equations. Each of the equations (=check nodes) have a number of inputs. During the iterative decoding all but one input are used to compute what the last input should be. However, an LDPC decoder can also check all the inputs and see if it is an even number of ones, i.e., the check equation is met. If all check equations are met, then the LDPC decoder has found a codeword.

Action 404. The network node re-permutes the decoded input bits into original order. In the receiver, the soft-bit input to the decoder may be permuted to fit multicore decoding, decoded and then restored to the original order by applying the inverses L' and R'.

Action 405. The network node may error check the decoded input bits. E.g. the decoded input bits are passed to an cyclic redundancy check (CRC) process and then further up the protocol stack to the user application.

As stated above, the H-matrix and the decoding graph may be two different representations of a same code. The decoding graph is a visual representation of the H-matrix. Thus, for a given H matrix there is a unique graph. In the H matrix, each row corresponds to a parity check equation and each column corresponds to a variable input (e.g. bit in the codeword). The 1's in a row tells which variables are part of that parity check equation. The 1's in a column tells which parity check equations depend on that variable. In the graph representation, the variables and check nodes correspond to the codeword bits and the check equations, and the edges correspond to the 1's—there is an edge between a variable node and a check node if and only if that variable is a part of that check equation.

In the multicore based decoding not all messages carried on the edges of the graph are updated in each iteration. Thus, the organization of rows and columns becomes important. To minimize the exchange of information between processing cores, a large number of connections between nodes mapped to the same processing core is preferred, and small number of ones between nodes mapped to different processing cores. The fraction of edges within and across communities is subject to optimization and specific algorithmic solutions.

In the H matrix, the submatrices corresponding to processing cores should have a higher fraction of 1's—be denser—than the rest of the H matrix. For simplicity and easy visualization, variable nodes and check nodes are grouped to be mapped to a given processing core together in the H matrix and place them on the main diagonal.

Let us consider an example with four processing cores. The parity check matrix H is given in (1).

$$H = \begin{bmatrix} H_{11} & H_{12} & H_{13} & H_{14} \\ H_{21} & H_{22} & H_{23} & H_{24} \\ H_{31} & H_{32} & H_{33} & H_{34} \\ H_{41} & H_{42} & H_{43} & H_{44} \end{bmatrix} \quad (1)$$

Here, each $H_{ij}$ is a submatrix. The 1's in submatrix $H_{ii}$ correspond to edges i.e. connections between variable nodes and check nodes that are mapped to core i. In other words, the 1's in the submatrices on the main diagonal correspond to connections within the different processing cores.

The 1's in submatrix H12 correspond to connections where the check nodes are in core 1 and the variable nodes are in core 2. The 1's in $H_{2j}$ correspond to connections where the check nodes are in core 2 and the variable nodes are in core 1. In general, the two matrices $H_{ij}$ and $H_{ji}$ connect nodes situated, either physically or logically, in cores i and j.

To minimize the exchanges between cores, we want $H_{ii}$ to be denser (have larger fraction of 1's) than the submatrices $H_{ij}$ with i≠j. However, if $H_{ij}$=0 for all i≠j, then we will have four independent shorter codes. The performance of the independent codes will be worse than for the long code. Therefore, the goal is to keep the density of off-diagonal submatrices lower than that of on-diagonal submatrices with at least some of them not equal to the zero matrix.

Embodiments herein transform the H matrix for any LDPC code into a format H' suitable for decoding on multicore hardware. H' should have block properties with higher density (fraction of 1's) blocks on the main diagonal and less dense or even some all-zero off-diagonal blocks. Since it starts from a given matrix, it is unlikely that we will be able to achieve all-zero off-diagonal blocks. However, a low density of ones corresponds to few connections between processing cores which is desirable.

Matrix Constructions.

Figure 5A:
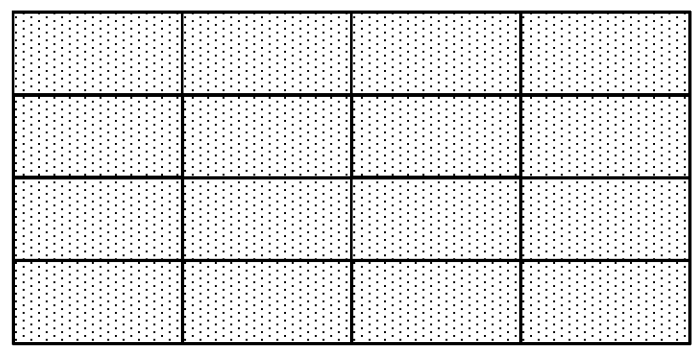
FIGS. 5A-5C show visual matrix representations according to some embodiments herein.
Figure 5B:
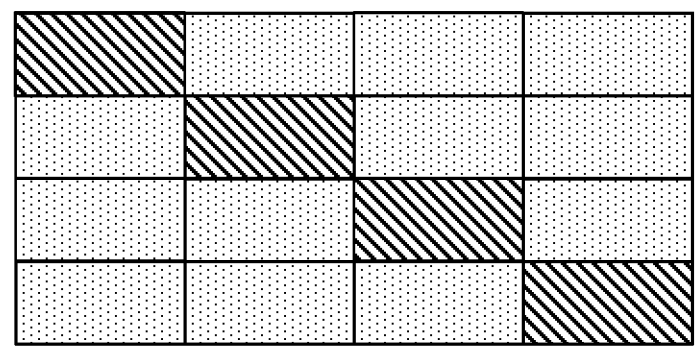
Figure 5C:
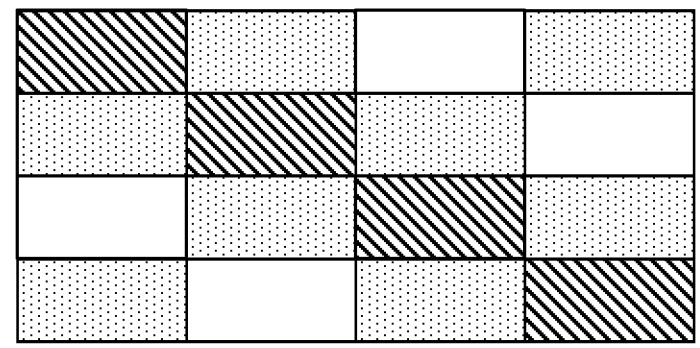

FIGS. 5A-5C illustrate schematic illustrations of matrix densities. FIG. 5A shows an original matrix with equal densities in entire matrix. Matrix constructions are herein introduced to reduce the number of connections between the processing cores. According to embodiments herein a diagonal-heavy matrix, shown in schematic form in FIG. 5B, is suggested, wherein denser blocks are on the main diagonal (diagonally striped blocks), and off-diagonal blocks are all non-zero blocks (see dotted blocks).

In the diagonal-heavy matrix, the sub-matrices on the main diagonal have higher density (fraction of 1's), whereas off-diagonal blocks have a lower, non-zero density.

Another embodiment is the band matrix. Here, one or more of the off-diagonal bands above and below the main diagonal are non-zero. In FIG. 5C it is shown an example with four processing cores and two non-zero bands. Note that the bands wrap around the upper-right and lower-left corners of the H matrix to connect the first and the last processing cores (see dotted blocks in the top-right and bottom-left corner). White sub-matrices are zero matrices. Thus, denser blocks are on main diagonal, and some off-diagonal blocks are all-zero blocks (white blocks).

Figure 6:
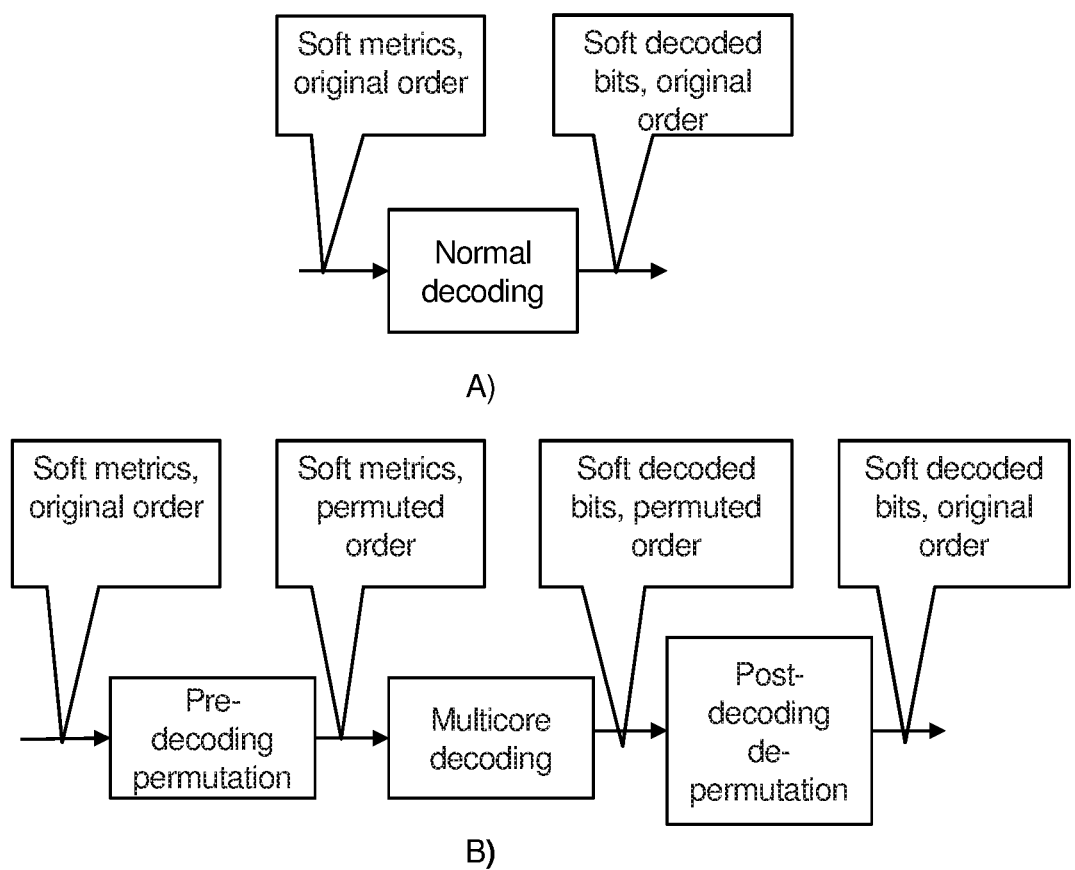
FIGS. 6A-6B show different examples of decoding input bits.

The transformation may be done by finding two permutation matrixes L and R such that H'=L*H*R where H' is the modified parity check matrix with block properties. In the receiver, the soft-bit input to the decoder is permuted to fit multicore decoding, decoded and then restored to the original order by applying the inverses L' and R'. This is illustrated schematically in FIGS. 6A-6B, which are schematic overviews of a system with A) normal decoding and B) proposed system with soft-bit reordering, multicore decoding and bit order restoration according to embodiments herein. FIG. 6A illustrates input bits with as soft metrics in an original order gets normal decoded into soft decoded bits of original order. FIG. 6B illustrates soft metrics in an original order that gets pre-decoded permuted into soft metrics of a permuted order, which are decoded in a plurality of processing cores (multicore decoded) into soft decoded bits in a permuted order. The decoded bits are then in a post-decoded de-permutation (re-permuted) reordered into soft decoded bits in the original order.

To determine to which degree a matrix is block diagonal, one may use a "diagonality metric" $\mu$ computed as $$\mu = \frac{\text{number of 1s in the blocks on the main diagonal}}{\text{total number of 1s in the matrix}}.$$

As stated above for a b-by-b block matrix with uniform distribution of 1s over the matrix $$\mu = \frac{1}{b},$$

and for a matrix where all off-diagonal blocks are all-zero $\mu=1$. Note that this results in b independent codes and a worse communication performance. Hence $\mu$ should be $$\frac{1}{b} < \mu < 1.$$

It is herein presented algorithms to find the desirable matrix H'. Given H and H', the permutation matrices L and R, and de-permutation matrices L' and R' can be found.

In one embodiment L, R, L' and R' are selected such that they get compact representations for easy implementation in hardware or compact description and fast execution in software. In this case the permuted matrix H" will be different from H' but the savings in representation of L, R, L' and R' may motivate possible communication performance loss.

Greedy Algorithm for Dividing a Matrix H into b-by-b Blocks.

The algorithm takes as its input the m-by-n matrix H, the number of processing cores/submatrices b, and an indication of whether the submatrices/ processing cores may have equal size to the extent possible.

Figure 7:
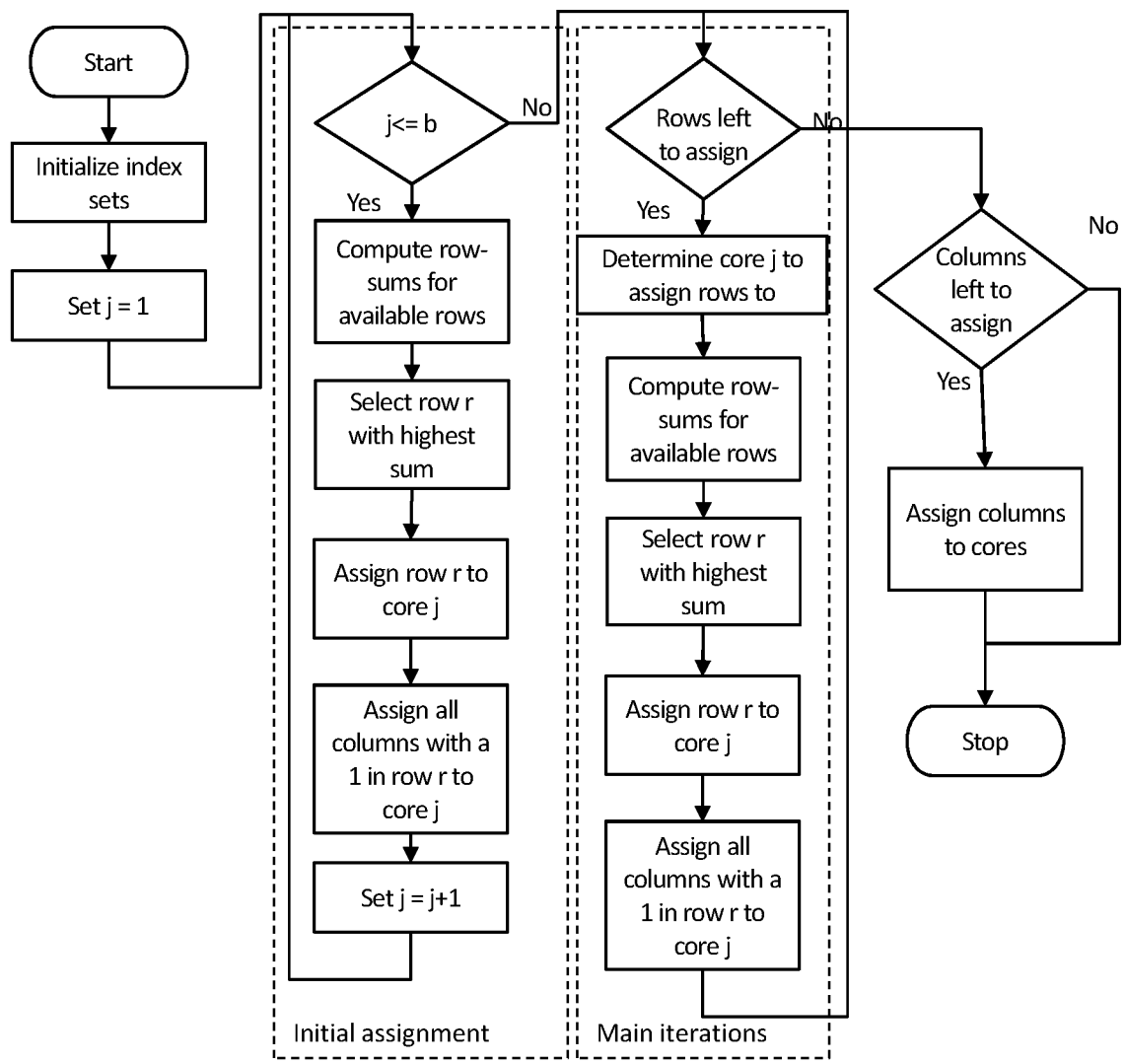
FIG. 7 shows a flowchart depicting an example of embodiments herein.

In the following the algorithm is described from a row-perspective, i.e., finding rows with maximum number of ones. The algorithm can equally well work on a column perspective, i.e., finding columns with maximum number of ones. In the description it is assumed that the H-matrix may be irregular, i.e., the rows do not all have the same number of ones. For regular matrices, there will be a number of ties and the tie-breaking mechanism will become more important. The algorithm is illustrated schematically in FIG. 7.

Initialize index sets
  Set available rows to 1 . . . #rows in H, and set available columns to 1 . . . #columns in H (here assuming indexing starting on 1)
  For each processing core let the set of assigned rows be an empty set and the set of assigned columns be another empty set. In total 2*b empty sets.
First assignments, for processing core j, j=1 . . . b
  Compute row-sum of available rows
  Select row r with highest sum. In case there are multiple rows with the same sum, select one of them at random.
  Assign row r to processing core j (Move index of this row from available set to set of assigned rows for processing core j)
  For all columns in the set of available columns where row r has ones, move those column indices from set of available columns to the set of columns assigned to processing core j.
Continued assignments
If rows left to assign (=set of available rows not empty), then
  Select next processing core j to assign. Examples how to select this includes cores 1 . . . b in a round robin fashion; all cores sorted smallest to largest number assigned; or the one processing core with smallest number assigned. The processing cores maybe of equal size and one or more processing cores may already have been assigned m/b rows, those processing cores may not be assigned any further rows.
  Assign rows and columns as in initial assignment
    Compute row-sum of available rows
    Select row r with highest sum, with possible tie-break
    Assign row r to processing core j (Move index of this row from available set to set of assigned rows for processing core j)
    For all columns in the set of available columns where row r has ones, move those column indices from set of available columns to the set of columns assigned to processing core j.
When the set of available rows is empty, if there are still columns still to be assigned, assign randomly either purely random or to give each processing core equal number of columns if all processing cores should have equal size.

Figure 8:
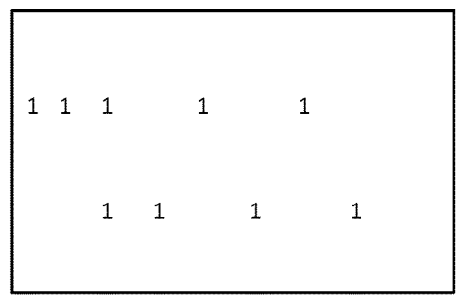
FIG. 8 shows an illustrative block diagram depicting some embodiments herein.
Figure 8:
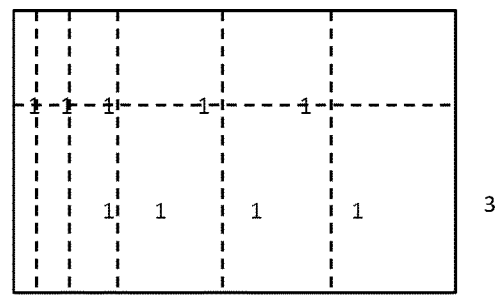
Figure 8:
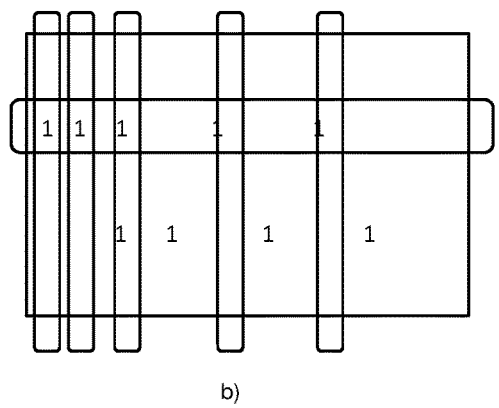
Figure 8:
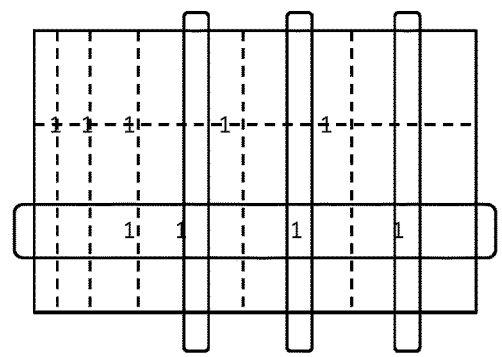

FIG. 8 shows an illustration of the greedy algorithm row and column selection wherein few rows, columns and 1s are shown. All blank areas are 0s. In the assignment for a processing core a) the row sums are computed, b) the row with the highest sum is selected, and all the columns with 1s in that row are selected, and the indices are added to the corresponding sets for that core, c) that row is removed from the set of available rows and the columns are removed from the set of available columns. The row sums are computed for the remaining matrix, d) the higher sum is selected, and the algorithm continues.

Random-Selection Algorithm for Dividing a Matrix H into b-by-b Blocks

The algorithm takes as input the m-by-n matrix H, the number of cores/submatrices b, the max number of trials without improvement (or other limit on the number of iterations) and an optional target diagonality metric.

Figure 9:
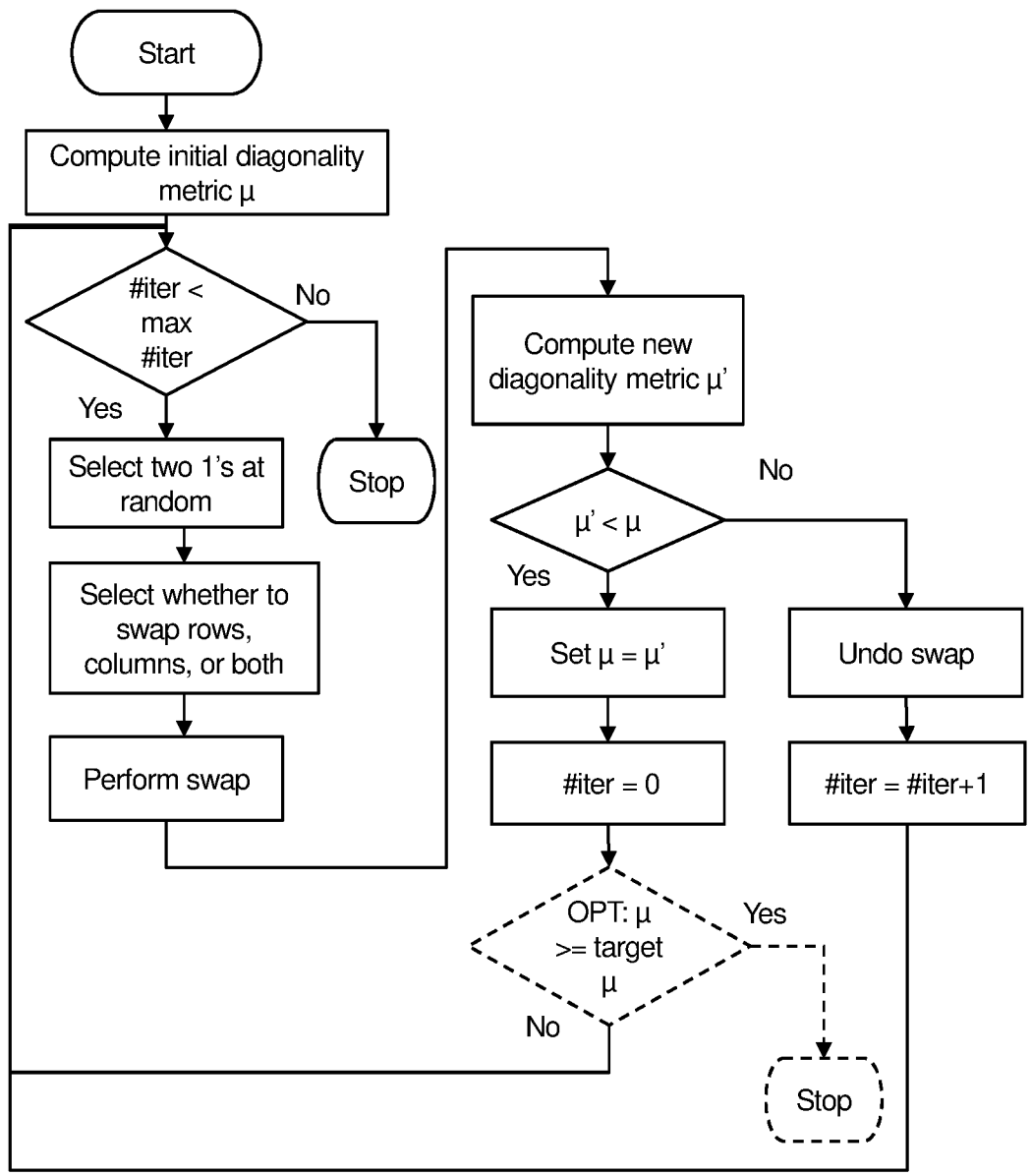
FIG. 9 shows a flowchart depicting an example of embodiments herein.

The algorithm is described below and illustrated in FIG. 9 and in FIG. 10.

Initialization
Compute initial diagonality metric for input matrix H for b cores
While number of trials<max number of trials without improvement
Randomly, or e.g. round robin, select two 1s in the matrix. Each 1 is associated with a row and a column
Randomly, or e.g. round robin, select whether to swap rows, columns, or both
Perform swap
If the diagonality metric increases, keep the swap and set the number of trials to 0, else undo the swap and increment the number of trials by one.
OPTIONAL: if a target diagonality metric is set, check whether the diagonality metric is met, and if so, break the loop FIG. 10 shows a method wherein two 1s have been selected a), and the corresponding columns are candidates for swapping, b) swapping the two columns would mean that the number of 1s in the main-diagonal blocks degreases (upper left block will lose a 1), thus the columns are not swapped, and c) the matrix is left as before. The iteration counter (not shown) is incremented, and the algorithm continues. In d) two 1 s are selected for a potential row swap, e) swapping the rows increases the diagonality metric μ, so f) the swap is performed and the iteration counter (not shown) set to zero.

Figure 10:
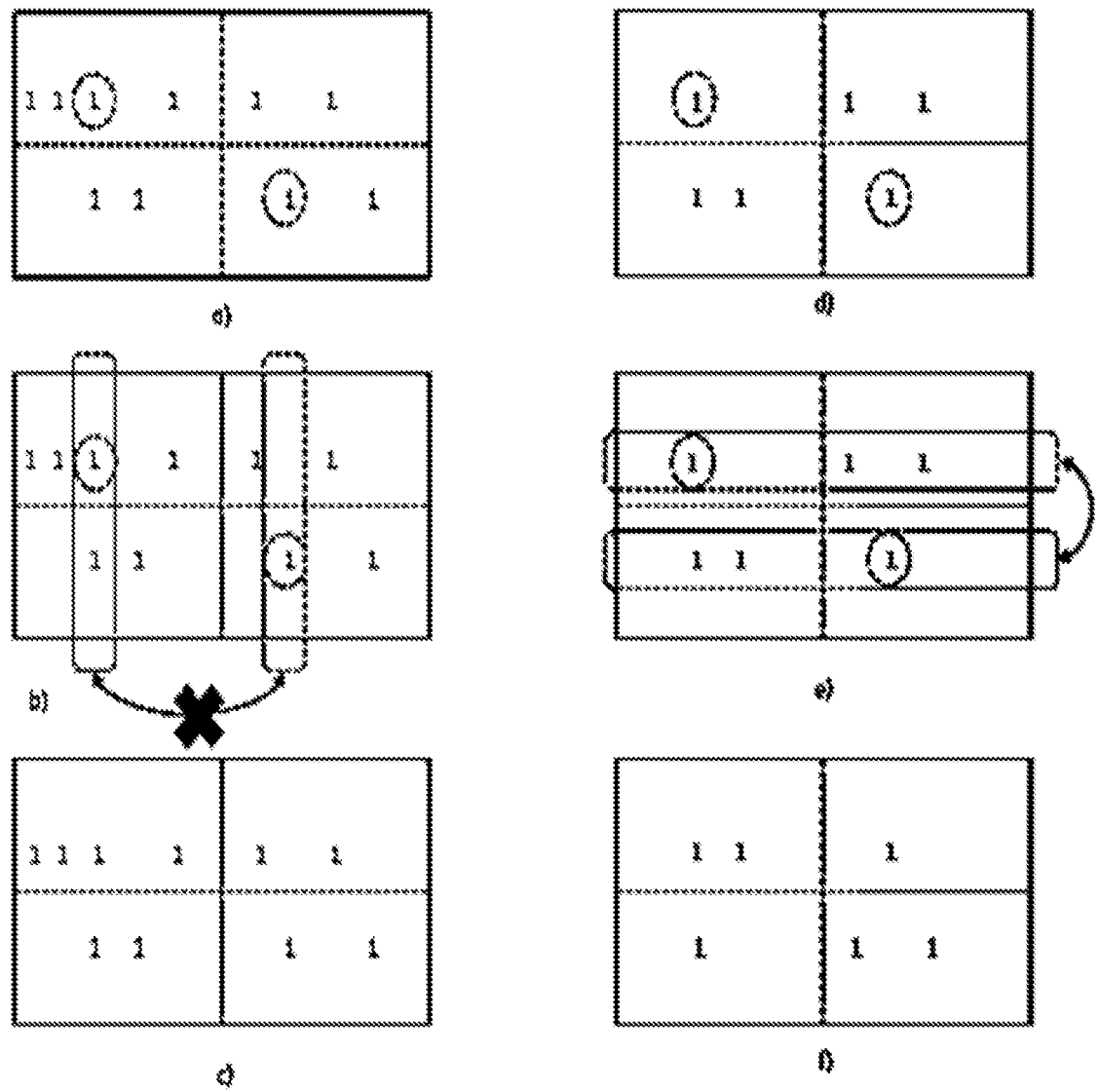
FIG. 10 shows an illustrative block diagram depicting some embodiments herein.

FIG. 10 shows an illustration of the random selection algorithm. The greedy and random selection algorithms can of course be combined, e.g., first running the greedy algorithm and then the random selection.

Community Recovery Algorithm

A Community recovery algorithm to transform a generic H into quasi block diagonal with B blocks is disclosed below.

A family of algorithms that can be used to transform any parity check matrix H into an equivalent H' that is denser along the diagonal blocks than outside. These algorithms are based on the maximum likelihood estimator (MLE) of the community recovery problem in random graphs.

The community recovery problem is the following problem in graph theory. Suppose that there are B random graphs, called communities. Nodes within each random graph are connected with probability p. Suppose that nodes in different communities are connected with probability q<p. Based upon an observation of an instance of the random graph, the problem is to retrieve the communities. The MLE is the best algorithm for recovering the communities, in the sense that the probability of misplacing any node in the wrong community is minimum for the MLE, provided that such communities exist.

In this example, instead of using the adjacency matrix of a graph, we apply similar ideas on the parity check matrix H. All the algorithms that are described below try to solve the following integer problem:

$$\max_{V,C} Tr(HVC^T)$$

where V and C are binary (elements in {0, 1}) orthogonal matrices of dimension m-by-B and n-by-B, respectively, where B is the number of blocks (cores) that we would like to find. The orthogonality condition is that $V^TV$ and $C^TC$ are diagonal matrices. This ensures that no node is placed in more than one community. The matrices V and C identify the variable node and check node communities, respectively, that is, we assign variable node j to core b if and only if $V_{jb}=1$, and we assign check node i to core b if and only if $C_{ib}=1$. All other elements of V and C are equal to 0.

There are several possible ways to solve this problem. Instead of trying to relax the problem, we keep it in its integer form and try to find reasonably good solutions. Relaxation is a common technique to solve integer problems, which are in general computationally hard in the sense that their computational complexity is exponential in the number of variables involved. However, relaxation is intrinsically suboptimal in the sense that some of the problems become theoretically unsolvable once relaxed even though they are solvable in their original integer form. For these reasons, we don't relax the problem.

Algorithm V1 (Random-Greedy)

1) Fix B, the number of blocks that we would like to create.
2) Initialize V and C at random while satisfying the constraints, i.e., assign nodes at random to the communities
3) For a given number of iterations:
   pick two communities at random
   pick two nodes at random within those two communities
   update the matrices V and C
   swap the nodes and evaluate the objective function $Tr(HVC^T)$ for the current choices of V and C
   keep the new matrices V and C if the objective function is the current maximum, i.e. larger than all previous evaluations, otherwise revert to the previous V and C.

Algorithm V2 (Random-Greedy Aiming At Improving Sparser-Than-Average Communities)

In this algorithm, instead of picking candidate communities at random, we assess what are the communities that are relatively sparser (sparser-than-average), and swap nodes in those communities. The rationale is that denser-than-average communities achieved the goal of the algorithm, and thus we prefer to modify the remaining ones.

The algorithm is as follows:
1) Fix B, the number of blocks that we would like to create.
2) Initialize V and C at random while satisfying the constraints, i.e., assign nodes at random to the communities
3) For a given number of iterations:
   compute the average density of each community as follows:
   $\theta_b := Tr(Hv_b c_b^T)/(n_b m_b)$ for each b in $\{1, \ldots, B\}$, where the desired dimension of block B is m_b-by-n_b
   compute the average density as follows:

$$\bar{\theta} = \frac{1}{B}\sum_{b=1}^{B} \theta_b$$

pick two communities at random among those with below-average density, that is, among those communities for which $\theta_b < \bar{\theta}$ (if there is only one below-average community, add any other one at random)
   pick two nodes at random within those two communities
   update the matrices V and C
   swap the nodes and evaluate the objective function $Tr(HVC^T)$ for the current choices of V and C
   keep the new matrices V and C if the objective function is the current maximum, i.e. larger than all previous evaluations, otherwise revert to the previous V and C.

Algorithm V3 (Random-Greedy with Focus on Improving the Two Sparsest Communities)

This algorithm is a variation of the previous one. Instead of focusing at each iteration on sparser-than-average communities, we focus on the two sparsest communities.

The algorithm is as follows:
1) Fix B, the number of blocks that we would like to create.
2) Initialize V and C at random while satisfying the constraints, i.e., assign nodes at random to the communities
3) For a given number of iterations:
   compute the average density of each community as follows:
   $\theta_b := Tr(Hv_b c_b^T)/(n_b m_b)$ for each b in $\{1, \ldots, B\}$, where the desired dimension of block B is m_b-by-n_b
   pick the two communities at with lowest $\theta_b$
   pick two nodes at random within those two communities
   update the matrices V and C
   swap the nodes and evaluate the objective function $Tr(HVC^T)$ for the current choices of V and C
   keep the new matrices V and C if the objective function is the current maximum, i.e. larger than all previous evaluations, otherwise revert to the previous V and C.

Figure 11:
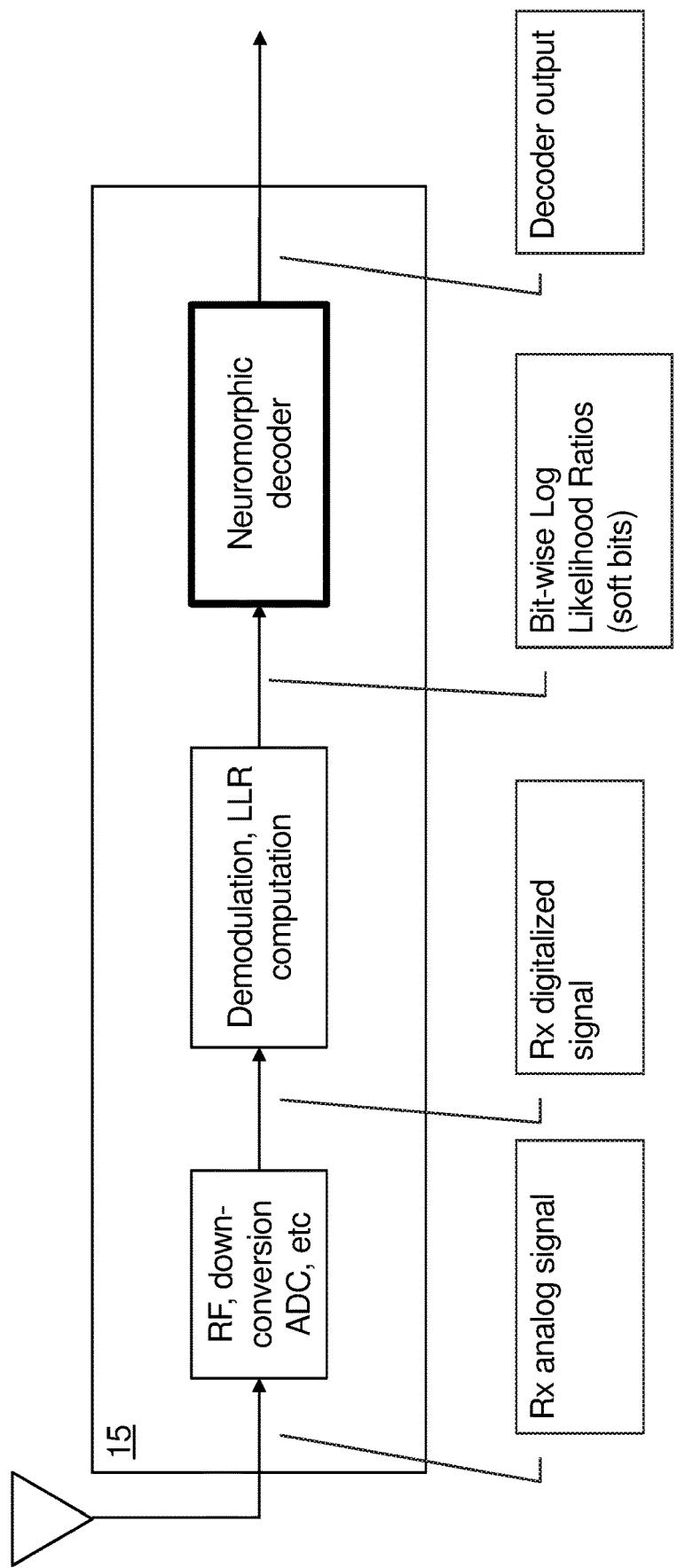
FIG. 11 shows a receiver comprising a decoding unit according to embodiments herein.

FIG. 11 is a block diagram depicting an example of a receiver handling a received signal. The receiver comprises a first module performing a radio frequency down conversion and an analogue to digital conversion, forming from an analog signal to a Rx digital signal. The receiver further comprises a second module performing e.g. demodulation and Log-likelihood ratio computation of the received signal e.g. into a bit-wise LLRs (soft bits). The receiver further comprises a third module comprising a decoder e.g. a neuromorphic decoder configured to perform the decoding over the at least two processing cores according to embodiments herein into a decoder output.

In general, the communication performance loss incurred by reducing the number of full (or global) iterations, i.e., iterations where the message exchange is accomplished among all processing cores, can be partially or totally regained by executing additional local iterations, i.e., iterations within processing cores where cross-core messages are frozen (unchanged). Under the assumption above, this can be done without incurring additional decoding delay. Embodiments herein discuss a specific case of using two processing cores and one bus system connecting the two processing cores. It should however be noted that extensions are possible. Embodiments herein are not limited to any specific network node, and can be implemented in any node or cloud system where core-based computation equipment is used. It is even conceivable that the bus system stretches e.g. between different nodes or server blades, though the bus delay will likely be longer in those cases. The codes used in this description are not optimized for multicore decoding. Thus, at least two processing cores, also referred to as computational cores, are connected to each other through the bus system. Information can flow through the bus system at much lower speed than within the processing cores, and thus the more computation can be carried inside each processing core and the less exchanges on the bus, the better. An algorithm for decoding general LDPC codes on several cores connected through a bus is herein proposed.

Figure 12:
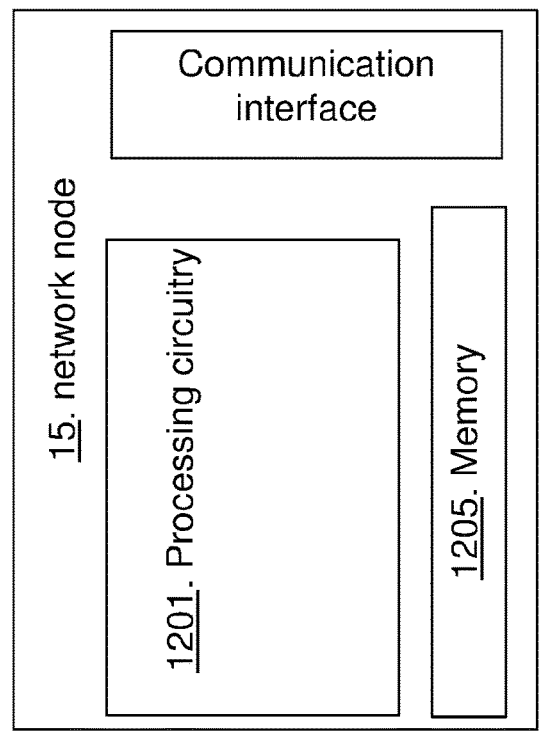
FIG. 12 shows a block diagram depicting a network node according to embodiments herein.
Figure 12:
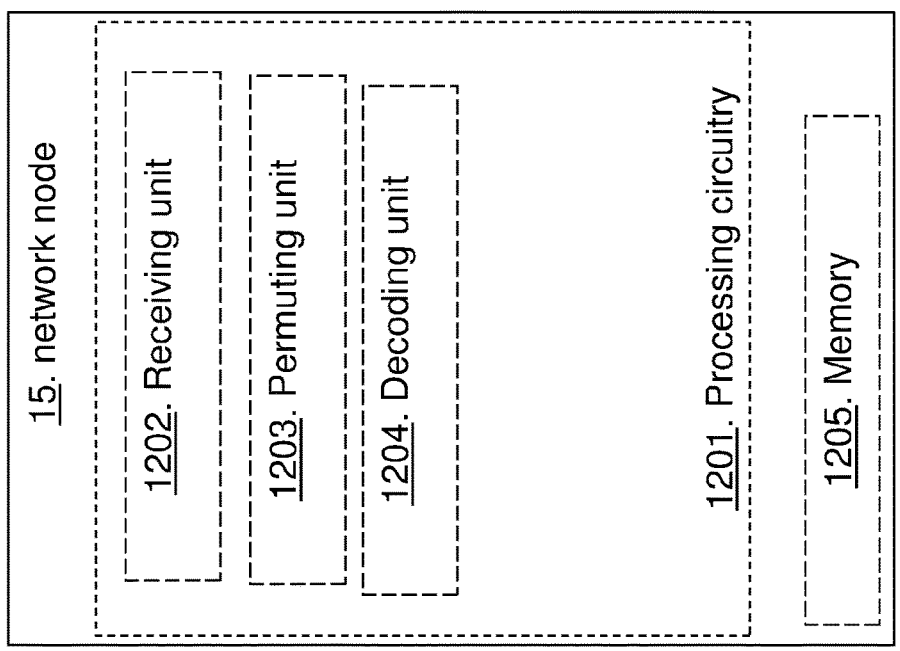
Figure 12:
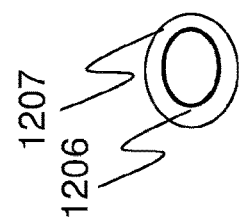

FIG. 12 is a block diagram depicting the network node 15, in two embodiments, for handling the received signal in the communication network according to embodiments herein. The network node 15 comprises at least two processing cores connected via the bus system for handling the received signal.

The network node 15 may comprise processing circuitry 1201, e.g. one or more processors, configured to perform the methods herein.

The network node 15 may comprise a receiving unit 1202, e.g. a receiver or transceiver. The network node 15, the processing circuitry 1201, and/or the receiving unit 1202 is configured to receive the input bits associated with the received signal. The input bits may represent the codeword.

The network node 15 may comprise a permuting unit 1203. The network node 15, the processing circuitry 1201, and/or the permuting unit 1203 is configured to permute the received input bits into the input bits of permuted order taking at least number of processing cores into account. The network node 15, the processing circuitry 1201, and/or the permuting unit 1203 may be configured to permute the received input bits by further taking into account variable inputs, check nodes and edges within communities of variable inputs, check nodes and edges, and across the communities in the code graph. The network node 15, the processing circuitry 1201, and/or the permuting unit 1203 may be configured to permute the received input bits to establish the modified matrix representation used when decoding the input bits. The network node 15, the processing circuitry 1201, and/or the permuting unit 1203 may be configured to permute the received input bits by swapping columns and/or rows in the original matrix representation into the modified matrix representation used when decoding the input bits.

The network node 15 may comprise a decoding unit 1204. The network node 15, the processing circuitry 801, and/or the decoding unit 1204 is configured to decode the input bits of the permuted order. The network node 15, the processing circuitry 1201, and/or the decoding unit 1204 may be configured to decode the input bits of permuted order by using the modified matrix representation, wherein each row of the modified matrix representation corresponds to a parity check equation and each column of the modified matrix representation corresponds to a variable input of the demodulated signal, and wherein the modified matrix representation comprises a more dense or denser configuration of ones of submatrices corresponding to respective processing core of the at least two processing cores than the rest of submatrices of the modified matrix representation.

The network node 15, the processing circuitry 1201, and/or the permuting unit 1203 is further configured to re-permute the decoded input bits into the original order.

The network node 15, the processing circuitry 1201, and/or the decoding unit 1204 may be configured to error check the decoded input bits.

The modified matrix representation may comprise the denser configuration of 1's on submatrices on the main diagonal blocks of the modified matrix representation.

The network node 15 further comprises a memory 1205. The memory comprises one or more units to be used to store data on, such as message passings, iterations, set schedule, values, permuting processes, variable inputs, outputs, functions, applications to perform the methods disclosed herein when being executed, and similar. The network node 15 may comprise a communication interface comprising e.g. a transmitter, a receiver, a transceiver, and/or one or more antennas. Thus, the network node 15 may comprise the processing circuitry and the memory, said memory comprising instructions executable by said processing circuitry whereby said network node is operative to perform the methods herein.

The methods according to the embodiments described herein for the network node 15 may respectively be implemented by means of e.g. a computer program product 1206 or a computer program, comprising instructions, i.e., software code portions, which, when executed on at least one processor, cause the at least one processor to carry out the actions described herein, as performed by the network node 15. The computer program product 1206 may be stored on a computer-readable storage medium 1207, e.g. a disc, a universal serial bus (USB) stick or similar. The computer-readable storage medium 1207, having stored thereon the computer program, may comprise the instructions which, when executed on at least one processor, cause the at least one processor to carry out the actions described herein, as performed by the network node 15. In some embodiments, the computer-readable storage medium may be a transitory or a non-transitory computer-readable storage medium.

In some embodiments a more general term "network node" or "radio network node" is used and it can correspond to any type of radio-network node or any network node or user equipment, which communicates with a computing device and/or with another network node. Examples of network nodes are UEs, servers, a NodeB (NB), an eNodeB, a gNB, a network node belonging to Master cell group (MCG) or Secondary cell group (SCG), base station (BS), multi-standard radio (MSR) radio node such as MSR BS, e, network controller, radio-network controller (RNC), base station controller (BSC), relay, donor node controlling relay, base transceiver station (BTS), access point (AP), transmission points, transmission nodes, Remote radio Unit (RRU), Remote Radio Head (RRH), nodes in distributed antenna system (DAS), etc.

In some embodiments the non-limiting term wireless device or user equipment (UE) is used and it refers to any type of wireless device communicating with a network node and/or with another wireless device in a cellular or mobile communication system. Examples of UE are target device, internet of things (IoT) capable device, device to device (D2D) UE, proximity capable UE (aka ProSe UE), machine type UE or UE capable of machine to machine (M2M) communication, Tablet, mobile terminals, smart phone, laptop embedded equipped (LEE), laptop mounted equipment (LME), USB dongles etc.

Embodiments are applicable to any RAT or multi-RAT systems, where the wireless device receives and/or transmit signals (e.g. data) e.g. New Radio (NR), Wi-Fi, Long Term Evolution (LTE), LTE-Advanced, Wideband Code Division Multiple Access (WCDMA), Global System for Mobile communications/enhanced Data rate for GSM Evolution (GSM/EDGE), Worldwide Interoperability for Microwave Access (WiMax), or Ultra Mobile Broadband (UMB), just to mention a few possible implementations.

As will be readily understood by those familiar with communications design, that functions means or units may be implemented using digital logic and/or one or more microcontrollers, microprocessors, or other digital hardware. In some embodiments, several or all of the various functions may be implemented together, such as in a single application-specific integrated circuit (ASIC), or in two or more separate devices with appropriate hardware and/or software interfaces between them. Several of the functions may be implemented on a processor shared with other functional components of a wireless device or network node, for example.

Alternatively, several of the functional elements of the processing means discussed may be provided through the use of dedicated hardware, while others are provided with hardware for executing software, in association with the appropriate software or firmware. Thus, the term "processor" or "controller" as used herein does not exclusively refer to hardware capable of executing software and may implicitly include, without limitation, digital signal processor (DSP) hardware and/or program or application data. Other hardware, conventional and/or custom, may also be included. Designers of communications devices will appreciate the cost, performance, and maintenance trade-offs inherent in these design choices.

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according one or more embodiments of the present disclosure.

It will be appreciated that the foregoing description and the accompanying drawings represent non-limiting examples of the methods and apparatus taught herein. As such, the apparatus and techniques taught herein are not limited by the foregoing description and accompanying drawings. Instead, the embodiments herein are limited only by the following claims and their legal equivalents.

| Abbreviation | Explanation |
| --- | --- |
| 5GS | 5G System |
| 5GC | 5G Core network |
| 5QI | 5G QoS Indicator |
| AMF | Access and Mobility Management Function |
| CHO | Conditional Handover |
| C-RNTI | Cell RNTI |
| DL | Downlink |
| eNB | Evolved Node B |
| eMBB | Enhanced Make-before-break |
| E-UTRAN | Evolved Universal Terrestrial Access Network |
| EPC | Evolved Packet Core network |
| gNB | 5 G Node B |
| HO | Handover |
| IE | Information Element |
| IIoT | Industrial Internet of Things |
| LTE | Long-term Evolution |
| MLE | Maximum Likelihood Estimator |
| NCC | Next Hop Chaining Counter |
| NG-RAN | Next Generation Radio Access Network |
| NR | New Radio |
| PDCP | Packet Data Convergence Protocol |
| RA | Random Access |
| RAR | Random Access Response |
| RAT | Radio Access Technology |
| RNTI | Radio Network Temporary Identifier |
| RRC | Radio Resource Control |
| Rx | Receive |
| SDU | Service Data Unit |
| SN | Secondary Node |
| SN | Sequence Number |
| sync | synchronization |
| Tx | Transmit |
| UE | User Equipment |
| UL | Uplink |
| UPF | User Plane Function |
| URLLC | Ultra-Reliable Low-Latency Communication |

REFERENCES

[1] Nvidia, "NVIDIA Tesla P100," whitepaper
[2] Davies, M.; et al., "Loihi: A Neuromorphic Manycore Processor with On-Chip Learning," IEEE Micro, vol. 38, no. 1, pp-82-99, January/February 2018.
[3] Merolla, P. A.; et al., "A million spiking-neuron integrated circuit with a scalable communication network and interface," Science. 345 (6197): 668, 2014.
[4] Yan, Yexin; Kappel, David; Neumarker, Felix; Partzsch, Johannes; Vogginger, Bernhard; Hoppner, Sebastian; Furber, Steve; Maass, Wolfgang; Legenstein, Robert; Mayr, Christian (2019). "Efficient Reward-Based Structural Plasticity on a SpiNNaker 2 Prototype". IEEE Transactions on Biomedical Circuits and Systems. 13 (3): 579-591.
[5] Jouppi, N. P.; et al. "In-Datacenter Performance Analysis of a Tensor Processing Unit," 44th International Symposium on Computer Architecture (ISCA), Toronto, Canada, Jun. 26, 2017.
[6] Qiumin Xu, Hyeran Jeon, Murali Annavaram and Ming Hsieh, "Graph Processing on GPUs: Where are the Bottlenecks?"

The invention claimed is:

1. A method performed by a network node for decoding a received signal in a communication network, the network node comprising a multi-core processor comprising at least two processing cores connected via a bus system for handling the received signal, the method comprising:
  receiving input bits associated with the received signal in an original order;
  permuting the received input bits into decoder input bits of permuted order taking at least a number of processing cores of the multi-core processor into account;
  decoding the decoder input bits of the permuted order with the multi-core processor;
  re-permuting the decoder input bits into the original order to generate a decoder output signal comprising a decoded representation of the received signal;
  passing the decoder output signal to another network node; and
  the decoding the decoder input bits of permuted order comprising using a modified matrix representation, each row of the modified matrix representation corresponding to a parity check equation and each column of the modified matrix representation corresponds to a variable input of the demodulated signal, and the modified matrix representation comprising a more dense configuration of ones of submatrices corresponding to respective processing core of the at least two processing cores than the rest of submatrices of the modified matrix representation.

2. The method according to claim 1, wherein permuting the received input bits further takes into account variable inputs, check nodes and edges within communities of variable inputs, check nodes and edges, and across the communities in the code graph.

3. The method according to claim 1, wherein permuting the received input bits is performed to establish the modified matrix representation used when decoding the input bits.

4. The method according to claim 3, wherein permuting the received input bits comprises swapping one or both of columns and rows in an original matrix representation into the modified matrix representation used when decoding the input bits.

5. The method according to claim 4, wherein selecting one or both of columns and rows to swap is performed one or both of randomly and using a process based on sum of ones in one or both of rows and columns in an original matrix representation.

6. The method according to claim 1, further comprising error checking the decoded input bits.

7. The method according to claim 1, wherein the input bits represent a codeword.

8. The method according to claim 1, wherein the modified matrix representation comprises the denser configuration of ones of submatrices arranged diagonally in the modified matrix representation.

9. A network node for decoding a received signal in a communication network, the network node comprising:
  a multi-core processor comprising at least two processing cores connected via a bus system for handling the received signal, the network node being configured to:
    receive input bits associated with the received signal in an original order;
    permute the received input bits into decoder input bits of permuted order taking at least a number of processing cores of the multi-core processor into account;

decode the decoder input bits of the permuted order with the multi-core processor;

re-permute the decoded input bits into the original order to generate a decoder output signal comprising a decoded representation of the received signal;

pass the decoder output signal to another network node; and the decoding the decoder input bits of permuted order comprising using a modified matrix representation, each row of the modified matrix representation corresponding to a parity check equation and each column of the modified matrix representation corresponds to a variable input of the demodulated signal, and the modified matrix representation comprising a more dense configuration of ones of submatrices corresponding to respective processing core of the at least two processing cores than the rest of submatrices of the modified matrix representation.

10. The network node according to claim 9, wherein the network node is configured to permute the received input bits by further taking into account variable inputs, check nodes and edges within communities of variable inputs, check nodes and edges, and across the communities in the code graph.

11. The network node according to claim 9, wherein the network node is configured to permute the received input bits to establish the modified matrix representation used when decoding the input bits.

12. The network node according to claim 11, wherein the network node is configured to permute the received input bits by swapping one or both of columns and rows in an original matrix representation into the modified matrix representation used when decoding the input bits.

13. The network node according to claim 12, wherein the network node is further configured to select one or both of columns and rows to swap is performed one or both of randomly and using a process based on sum of ones in one or both of rows and columns in an original matrix representation.

14. The network node according to claim 9, wherein the network node is further configured to error check the decoded input bits.

15. The network node according to claim 9, wherein the input bits represent a codeword.

16. The network node according to claim 9, wherein the modified matrix representation comprises denser configuration of ones of submatrices arranged diagonally in the modified matrix representation.

17. A non-transitory computer-readable storage medium, having stored thereon a computer program comprising instructions which, when executed on at least one processor, cause the at least one processor to carry out a method for handling a received signal, the method being performed by a network node, the network node comprising a multi-core processor comprising at least two processing cores connected via a bus system for decoding the received signal, the method comprising:

receiving input bits associated with the received signal in an original order;

permuting the received input bits into decoder input bits of permuted order taking at least a number of processing cores of the multi-core processor into account;

decoding the decoder input bits of the permuted order;

re-permuting the decoded input bits into the original order to generate a decoder output signal comprising a decoded representation of the received signal;

passing the decoder output signal to another network node; and the decoding the decoder input bits of permuted order comprising using a modified matrix representation, each row of the modified matrix representation corresponding to a parity check equation and each column of the modified matrix representation corresponds to a variable input of the demodulated signal, and the modified matrix representation comprising a more dense configuration of ones of submatrices corresponding to respective processing core of the at least two processing cores than the rest of submatrices of the modified matrix representation.

* * * * *